(12) United States Patent
Hawley et al.

(10) Patent No.: US 8,385,709 B2
(45) Date of Patent: Feb. 26, 2013

(54) STRUCTURED CABLING SOLUTIONS

(75) Inventors: Mark Robert Hawley, Spokane, WA (US); Jeremy James Gallagher, Spokane, WA (US); Walter Dean Takisaki, Spokane Valley, WA (US); James Patrick Jenkins, Liberty Lake, WA (US)

(73) Assignee: Telect Inc., Liberty Lake, WA (US)

( * ) Notice: Subject to any disclaimer, the term of this patent is extended or adjusted under 35 U.S.C. 154(b) by 1303 days.

(21) Appl. No.: 11/779,824

(22) Filed: Jul. 18, 2007

(65) Prior Publication Data

US 2008/0298762 A1 Dec. 4, 2008

Related U.S. Application Data

(60) Provisional application No. 60/941,610, filed on Jun. 1, 2007.

(51) Int. Cl.
*G02B 6/00* (2006.01)
*H02B 1/01* (2006.01)

(52) U.S. Cl. .................. 385/135; 385/137; 361/627

(58) Field of Classification Search .......... 385/134–137; 361/627, 724–730
See application file for complete search history.

(56) References Cited

U.S. PATENT DOCUMENTS

| | | | |
|---|---|---|---|
| 5,145,380 A | 9/1992 | Holcomb et al. | |
| 5,741,153 A | 4/1998 | Schwer | |
| 6,535,682 B1 * | 3/2003 | Puetz et al. | 385/135 |
| 6,597,578 B2 | 7/2003 | Shiina et al. | |
| 7,140,782 B2 | 11/2006 | Frohlich et al. | |
| 7,352,975 B2 | 4/2008 | Fujiwara et al. | |
| 2005/0178573 A1 | 8/2005 | James | |
| 2005/0266720 A1 | 12/2005 | Lin | |
| 2005/0272304 A1 | 12/2005 | Gorman | |
| 2006/0008231 A1 | 1/2006 | Reagan et al. | |
| 2006/0070277 A1 | 4/2006 | Bungerz | |
| 2006/0255788 A1 | 11/2006 | Porcu et al. | |

FOREIGN PATENT DOCUMENTS

| | | |
|---|---|---|
| JP | 11089058 A | 3/1999 |
| KR | 20000058543 A | 10/2000 |
| KR | 20020068307 A | 8/2002 |

OTHER PUBLICATIONS

"Leviton Structured Media Panels", retrieved on Jul. 17, 2007 at <<http://www.hometech.com/techwire/leviton.html>>, HomeTech Solutions.
Reed, "Telect eyes home market, evolves", retrieved on Jun. 1, 2007 at <<http://www.spokanejournal.com/spokane_id=article&sub=3183>>, Spokane Journal of Business.
"Structured Cabling Systems", retrieved on Jul. 17, 2007 at <<http://www.leviton.com>>, Leviton.
PCT International Search Report for PCT Application No. PCT/US2008/063401, mailed Oct. 30, 2008 (3 pages).
Non-Final Office Action for U.S. Appl. No. 11/779,826, mailed on May 13, 2011, Mark Robert Hawley, "Structured Cabling Chassis," 10 pages.

* cited by examiner

*Primary Examiner* — Kevin S Wood
(74) *Attorney, Agent, or Firm* — Lee & Hayes, PLLC

(57) ABSTRACT

Structured cabling solutions may include techniques and systems usable to route, organize, and otherwise manager wires, optical fibers, and other cables. Structured cabling solutions may include one or more chassis coupled to and movable relative to a frame to provide access to signal connectors on the chassis. Structured cabling solutions may also include labeling schemes that identify patch connectors that correspond to outlets in a structured cabling installation.

12 Claims, 14 Drawing Sheets

STRUCTURED CABLING SOLUTIONS

This application claims the benefit of U.S. Provisional Application No. 60/941,610 (TL1-0089USP1), filed Jun. 1, 2007, which is incorporated herein by reference. This application is also related to concurrently-filed U.S. patent application Ser. No. 11/779,826 entitled "Structured Cabling Chassis," and U.S. patent application Ser. No. 11/779,827 entitled "Intuitive Labeling Schemes for Structured Cabling Solutions," both of which are incorporated herein by reference.

BACKGROUND

Most new homes today are wired for electricity, telephone, and cable television. Homebuyers are also asking that their homes be wired for computer networks, media systems, speaker systems, intercoms, voice over internet protocol (VOIP), alarm systems, and a host of other data, voice, and other media systems. New home builders often are not familiar with all of the equipment and wiring that may be necessary for the systems desired by their customers.

Accordingly, the home builders may contract with one or more subcontractors to install each of the systems desired by the homebuyer. In that case, unless the subcontractor coordinates with the home builder and any other subcontractors, the wiring and equipment installed to support one system may be insufficient to support another system, may be duplicative, and/or may be incompatible with other systems installed in the home. Even if the systems installed in the home are functionally compatible with one another, the systems may not be as easily integrated with one another as if they had been installed as part of a comprehensive system. For example, different styles or brands of equipment may be used, or the equipment may be installed at different locations in the home.

Another problem with existing data and telecommunication system installations is that, once installed, it may not be readily apparent to the homebuyer and/or to service provider technicians how to use the systems. This difficulty in understanding how the system is organized may result in incorrect equipment hookups, wasted time, and frustration on the part of the homebuyer and technicians.

SUMMARY

This summary is provided to introduce simplified concepts of structured cabling solutions, which are further described below in the Detailed Description. This summary is not intended to identify essential features of the claimed subject matter, nor is it intended for use in determining the scope of the claimed subject matter. Generally, structured cabling solutions refer to techniques and systems usable to route, organize, and otherwise manage wires, optical fibers, and other cables.

In one aspect, a system may comprise multiple chassis coupled to a frame. The chassis each may include one or more signal connectors having a patch side and a terminal side. The chassis may be configured to allow user access to the terminal side of the signal connectors without disconnecting a patch cable coupled between the patch side of a signal connector of one chassis and the patch side of a signal connector of a second chassis.

In another aspect, a structured cabling system may include at least three zones of signal carrier connectors, each zone having a different level of accessibility.

In another aspect, a structured cabling frame may include multiple signal connectors, and may define multiple predefined patch cable pathways. The predefined patch cable pathways may consist of substantially vertical pathways and substantially horizontal pathways.

In another aspect, a telecommunications chassis may include first and second substantially planar side members and a central spine. The central spine may be interposed between, and pivotably coupled to, the first and second side members.

In another aspect, a telecommunications apparatus may include a frame, with one or more chassis movably coupled to the frame. One or more signal connectors may be coupled to each chassis, with a patch connection thereof disposed on the front side of the chassis and a terminal connection on the back side of the chassis. The chassis may be movable relative to the frame between a first position in which the terminal connections on the back side of the chassis are disposed between the chassis and the frame and are inaccessible to a user, and a second position in which the terminal connections are accessible to a user.

In another aspect, a telecommunications chassis may include a substantially planar body having dimensions of at least about 13 and at most about 15 inches wide, and at least about 4 and at most about 7 inches high.

In another aspect, a telecommunications module may include a mounting plate having dimensions of at least about 4.5 and at most about 6 inches wide, and at least about 1 inch and at most about 2 inches tall.

In another aspect, a system may include an outlet and a telecommunications module. The outlet may include an outlet identifier and at least one signal connector. The signal connector may have a signal connector identifier. The telecommunications module may include at least one signal connector communicatively coupled to the signal connector of the outlet. The signal connector of the telecommunications module may be labeled with the outlet identifier and signal connector identifier of the signal connector to which it is communicatively coupled.

In still another aspect, an outlet may include a wall plate having a plurality of cutouts. At least one signal connector may be removably disposed in one of the cutouts, and may have a signal connector identifier. An insert may be removably disposed in another of the cutouts, the insert comprising an outlet identifier.

In yet another aspect, a telecommunications module may include a module body, at least one signal connector coupled to the module body, and a label associated with the signal connector of the module body. The label may designate an outlet and a receptacle within the outlet, to which the signal connector of the module body is configured to be communicatively coupled.

While described individually, the foregoing aspects are not mutually exclusive and any number of the aspects may be present in a given implementation.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

As discussed above, there is an increasing demand for homes and offices wired for a variety of different data-, communication-, and power-related systems. Often these systems are installed at different times and/or by different contractors, so the wiring for one of these systems may be insufficient to support other systems. Also, the systems may not be linked to one another or even compatible with one another due to incompatible parts, different locations of the wiring terminations, or the like. Still further, it may not be readily apparent to the homebuyer and/or to service provider technicians how to use the systems independently or together.

This disclosure relates to comprehensive structured cabling solutions capable of flexibly supporting multiple different systems throughout a home. Generally, the structured cabling solutions provide intuitive methods of distributing, routing, organizing, and otherwise managing wires, optical fibers, and/or other cables of the structured cabling solution. Structured cabling solutions are described herein in the context of residential installations, but are more broadly applicable to any residential, business, industrial, or other installation. Also, while this description describes structured cabling solutions within a structure, structured cabling solutions may extend to multiple structure installations, such as housing developments, office parks, apartment complexes, or the like.

Illustrative Structured Cabling Installation

Figure 1:
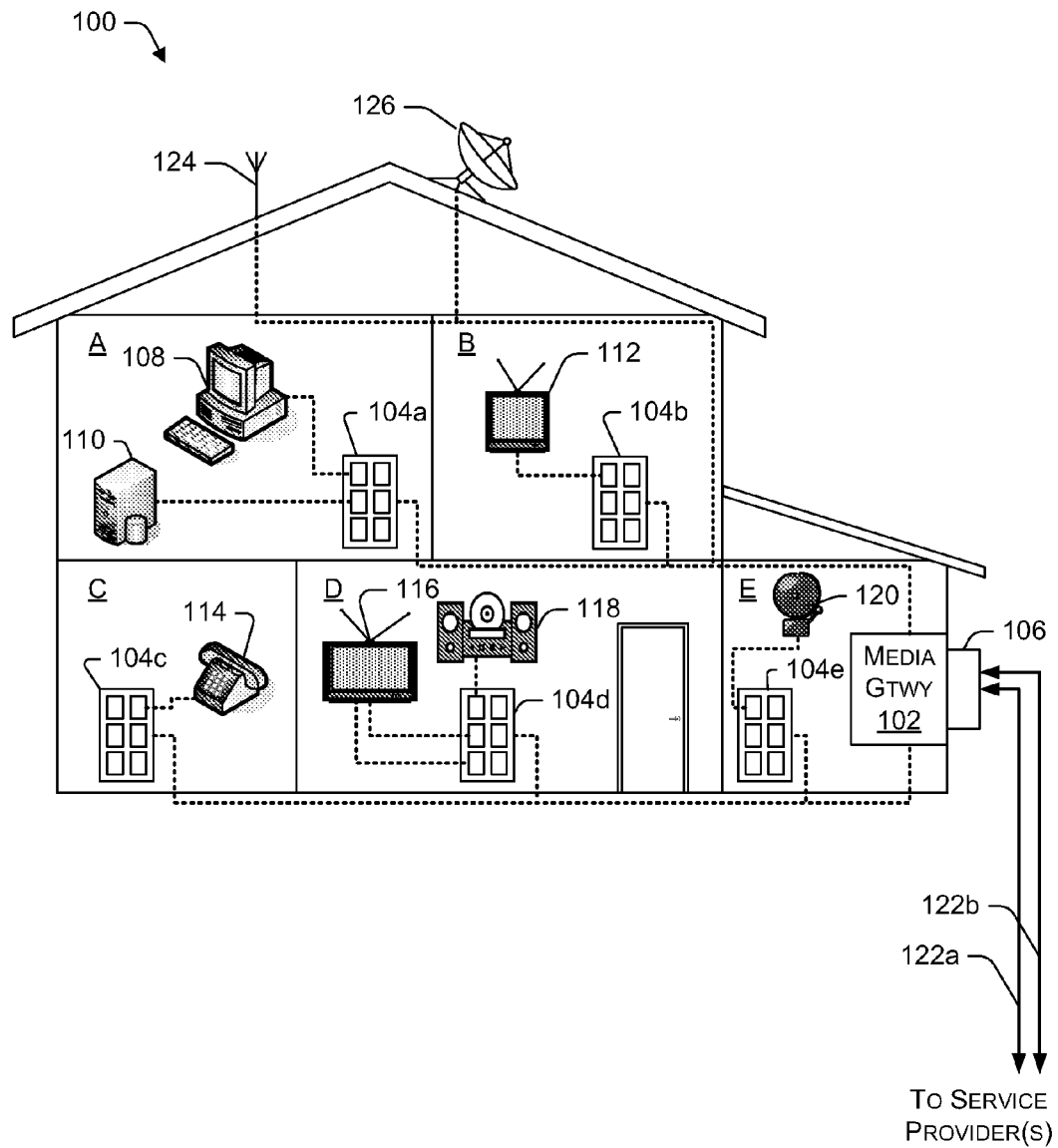
FIG. 1 is a schematic diagram showing a structure with an illustrative structured cabling installation.

FIG. 1 is a schematic diagram showing a home 100 with an illustrative structured cabling installation capable of flexibly supporting multiple different systems throughout the home 100. The structured cabling installation generally includes a media gateway 102 and a number of outlets 104a-104e (collectively referred to as outlets 104) located throughout the home 100 and coupled to the media gateway 102 by one or more signal carriers. The outlets 104 include receptacles, into which a variety of different data, voice, and/or media equipment may be plugged.

In the implementation described herein the signal carriers comprise twisted pair copper wire, such as category 5 (Cat 5) cable. In other implementations, the signal carriers may additionally or alternatively comprise other signal carriers, such as, for example, optical fibers, other copper wires (e.g., Cat 1, Cat 2, Cat 3, Cat 4, Cat 5e, Cat 6, Cat 6a, Cat 7, etc.), or the like.

One or more outside lines (e.g., from one or more service providers) or other communication equipment (e.g., wireless transmission equipment) may also terminate at the media gateway 102 or at a separate service provider box 106 located outside the home 100 or at another location accessible by service provider technicians. Some examples of outside lines include cable television lines, telephone service lines, broadband Internet service lines, dedicated network pipelines, and the like. Some examples of other communication equipment include antennas, satellite dishes, receivers, transmitters, and the like.

The media gateway 102 serves as a junction where some or all of the outlets, outside lines, and/or any other transmission equipment may be cross-connected as desired to support various systems. Thus, the media gateway 102 allows any of the various outlets, outside lines, and other communication equipment terminated at the media gateway 102 to be easily connected or patched to one or more other outlets, outside lines, or communication equipment terminated at the media gateway 102.

As shown in FIG. 1, the outlets 104 are installed in a number of rooms A-E throughout the house 100. While five rooms are shown, structured cabling solutions may be designed for structures having any number and size of rooms. Additionally, any number of outlets may be provided in each room. In the illustrated implementation, room A has an outlet 104a with receptacles, into which are plugged a personal computer 108 and a media server 110. Room B has an outlet 104b with a receptacle, into which is plugged an electronic display 112, such as a computer monitor or electronic picture frame. Room C has a telephone 114 plugged into a receptacle of outlet 104c, and Room D has a television 116 and a stereo system 118 plugged into receptacles of outlet 104d. As mentioned above, each of the outlets 104a-104d is communicatively coupled to the media gateway 102. An alarm system 120 is plugged into a receptacle in outlet 104e in room E, and may include one or more sensors or components (not shown) at other locations throughout the house. The alarm system 120 is communicatively coupled to the media gateway 102. Also communicatively coupled to the media gateway 102 are one or more service provider lines 122 (e.g., a telephone service line 122a, a cable television service line 122b, etc.) or other outside lines (e.g., wide area network cables, broadband Internet cables, etc.), an antenna 124, and a satellite dish 126.

From the media gateway 102, each receptacle in the outlets 104 may be selectively connected to one of the service provider lines 122, the antenna 124, the satellite dish 126, or any other available source or recipient of media content. Additionally or alternatively, each receptacle may be connected to any other receptacle(s) in the structured cabling installation. Generally, these connections are made by patching one receptacle or service to another. Additional details of how the patch connections may be made are described in the following sections.

Illustrative Structured Cabling Panel (SCP)

Figure 2:
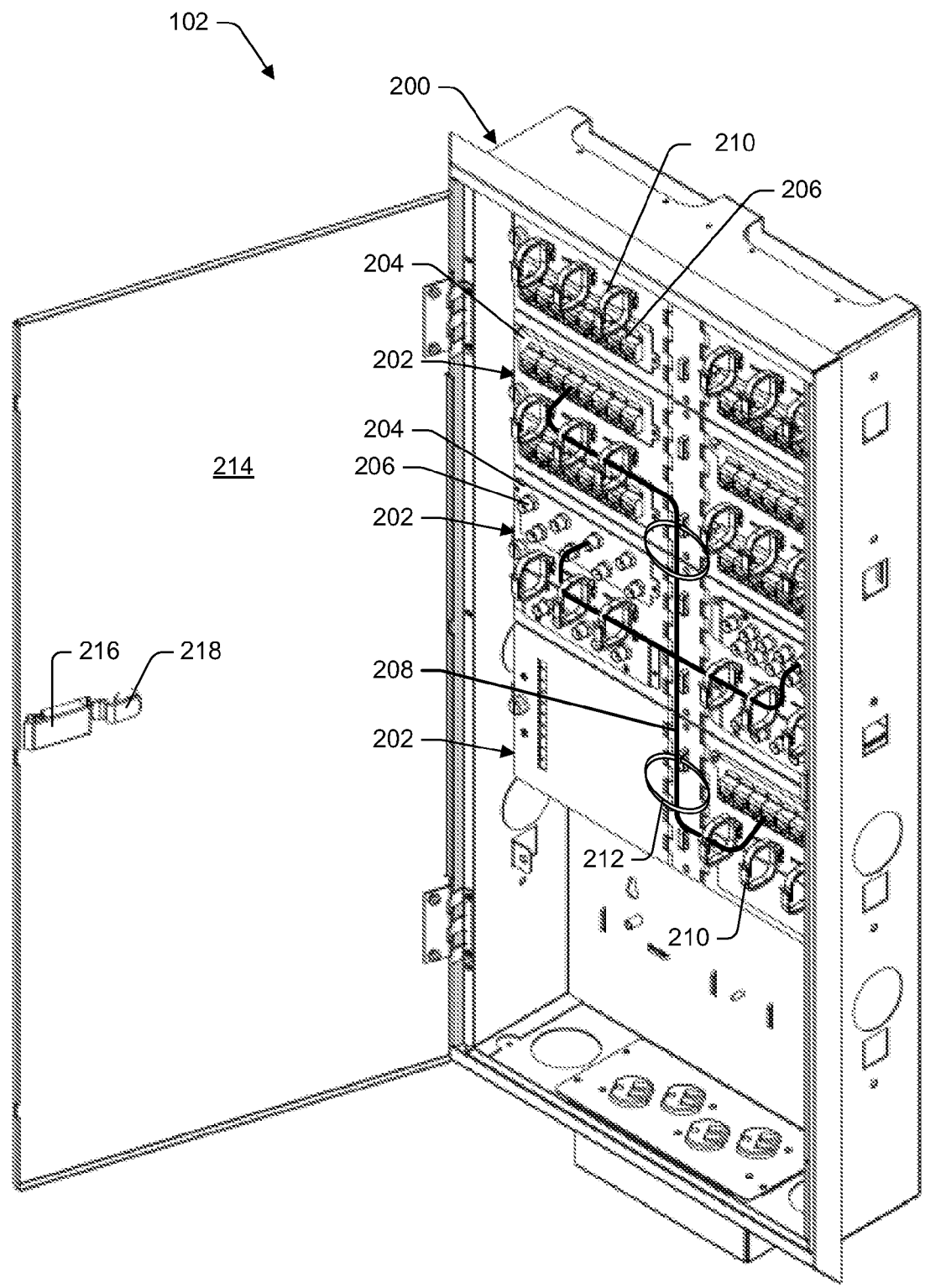
FIG. 2 is a perspective view of an illustrative structured cabling panel according to one implementation, with a number of illustrative chassis mounted therein.

FIG. 2 is a perspective view of the media gateway 102 according to one implementation. In this implementation, the media gateway includes a frame 200 with a number of chassis 202 coupled thereto. While the frame 200 is shown in this implementation as having substantially planar walls defining an enclosure, in other implementations, the frame may have any number of one or more walls. In one alternatively implementation, the top and bottom walls of the panel may be omitted, such that the panel has three walls, a back wall and two sidewalls. In another alternative, instead of walls, the frame may comprise a substantially open framework.

The chassis 202 may have a variety of different telecommunications modules 204 having components, such as signal connectors 206 (e.g., RJ45 connectors, coaxial connectors, optical fiber connectors, and the like), switches, amplifiers, splitters, combiners, power receptacles, power supplies, cover plates, or any other component suited for a particular structured cabling installation. Also, the number, type, and location of the chassis on the panel 200 may vary depending on the size and nature of a particular structured cabling installation.

In the case shown in FIG. 2, the chassis 202 include signal connectors 206 including a patch connection side and a terminal or termination side. The signal connectors 206 are mounted to the chassis such that the patch connection side is on one side of the chassis (the visible front side shown in FIG. 2) and the terminal side is oriented toward the other side of the chassis (the non-visible back side of the chassis in FIG. 2). Each receptacle in the outlets 104 is connected to the terminal side of a signal connector 206 in the media gateway 102. One or more outside lines and/or other communications equipment (e.g., cable television line, phone line, antenna, satellite dish, etc.) may also be connected to the terminal side of one or more signal connectors 206 in the media gateway 102. The signal connectors 206 in the gateway corresponding to outlet receptacles may then be patched to one another, the outside lines, and/or other communications equipment using patch cables 208, which are routed and held in place by cable guides 210 and/or cable retention straps 212. Anchor points, such as apertures, lances (i.e., punched-out bridge or loop formed in the panel 200), knockouts, slots, grooves, or the like, may be provided to secure the cable guides 210, cable retention straps 212, or other cable routing hardware to the panel 200. The media gateway 102 may, but need not, include an access door 214 including a latch 216 and/or a lock 218.

Figure 3:
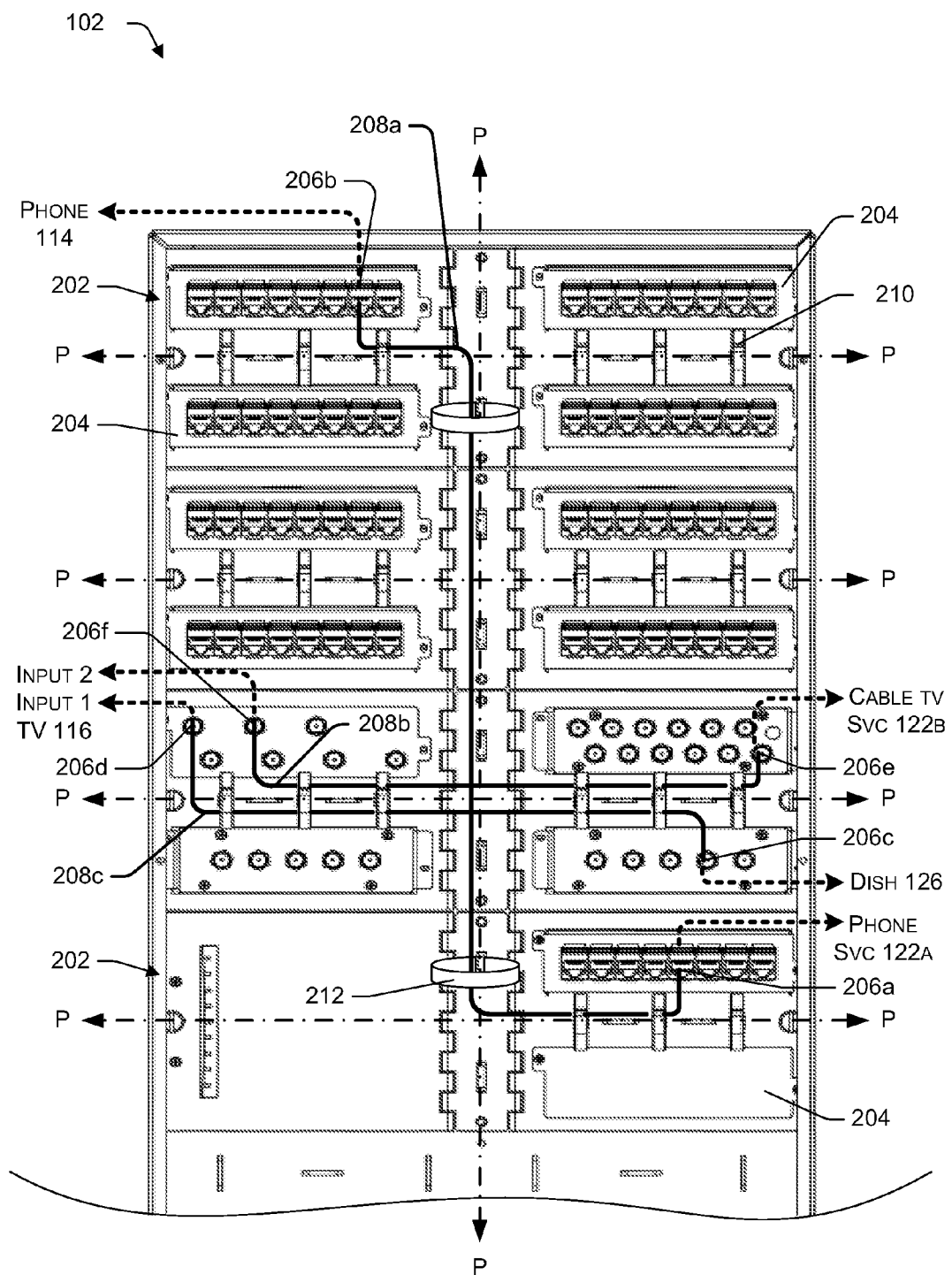
FIG. 3 is a front view showing the structured cabling panel of FIG. 2 in more detail.

FIG. 3 is a front view of the media gateway 102 shown in FIG. 2, illustrating several examples of how patch cables 208 may be installed to interconnect outlet receptacles to one another, the outside lines, and/or other communications equipment. As shown in FIG. 3, outside telephone service line 122a is terminated to the terminal side of signal connector 206a, and the receptacle into which the telephone 114 plugged is terminated to the terminal side of signal connector 206b. Telephone service can be provided to the telephone 114 by plugging one end of a patch cable 208a into the patch side of the signal connector 206a and the other end of the patch cable 208a into the patch side of signal connector 206b.

As also shown in FIG. 3, television 116 is provided with satellite service from satellite dish 126 and cable service from outside cable television service line 122b. Specifically, satellite dish 126 is terminated to a terminal side of signal connector 206c. Outside cable television service line 122b is terminated to the terminal side of signal connector 206e. First and second inputs of television 116 are plugged into receptacles that are terminated to RF signal connectors 206d and 206f, respectively. Satellite television service is provided to the first input of television 116 by connecting a patch cable 208b between the patch side of signal connectors 206c (corresponding to outside cable television service 122b) and 204d (corresponding to input 1 of television 116). Cable television service is provided to the second input of television 116 by connecting a patch cable 208c between the patch side of signal connectors 206e (corresponding to outside cable television service 122b) and 204f (corresponding to input 2 of television 116).

As shown in FIGS. 2 and 3, the patch side of the signal connectors 206 is readily accessible from the front of the media gateway 102. However, the chassis 202 are configured such that the terminal side of the signal connectors 206 is also accessible without disconnecting or interfering with the patch cables 208. In various implementations, this accessibility may be facilitated by the chassis 202 being pivotable at least in part relative to the frame 200. For example, the chassis 202 may be pivotable between a first position in which the terminal side of the signal connectors 206 is enclosed within the frame 200 and is inaccessible, and a second position in which the terminal side of the signal connectors 206 is accessible. This and several other illustrative chassis configurations that allow for unobstructed access to the terminal side of the signal connectors are described in the following section entitled "Illustrative Structured Cabling Chassis."

Generally, the patch cables 208 are routed between patch connections along one or more predefined patch cable pathways P. In the illustrated implementation, the predefined patch cable pathways P are defined by the cable guides 210 (e.g., plastic or metal cable guides) and the cable retention straps 212 (e.g., rubber or Velcro® straps). However, in other implementations, patch cable pathways may be additionally or alternatively defined by other cable management features, such as troughs, channels, clips, clamps, or any other suitable cable management structure.

In some implementations, such as the one shown in FIGS. 2 and 3, the predefined patch cable pathways P consist of substantially vertical pathways and substantially horizontal pathways. By routing patch cables in such substantially vertical and substantially horizontal pathways, a patch cable routing pathway between any two signal connectors 206 remains substantially constant length, regardless of position of the chassis 202 relative to the frame 200 other chassis 202. In addition, routing patch cables in substantially horizontal and/or vertical patch cable pathways routes the patch cables in a way that does not obstruct movement of the chassis. However, in other implementations, patch cables may additionally or alternatively be routed in non-horizontal and non-vertical patch cable pathways.

Illustrative Structured Cabling Chassis

Figure 4:
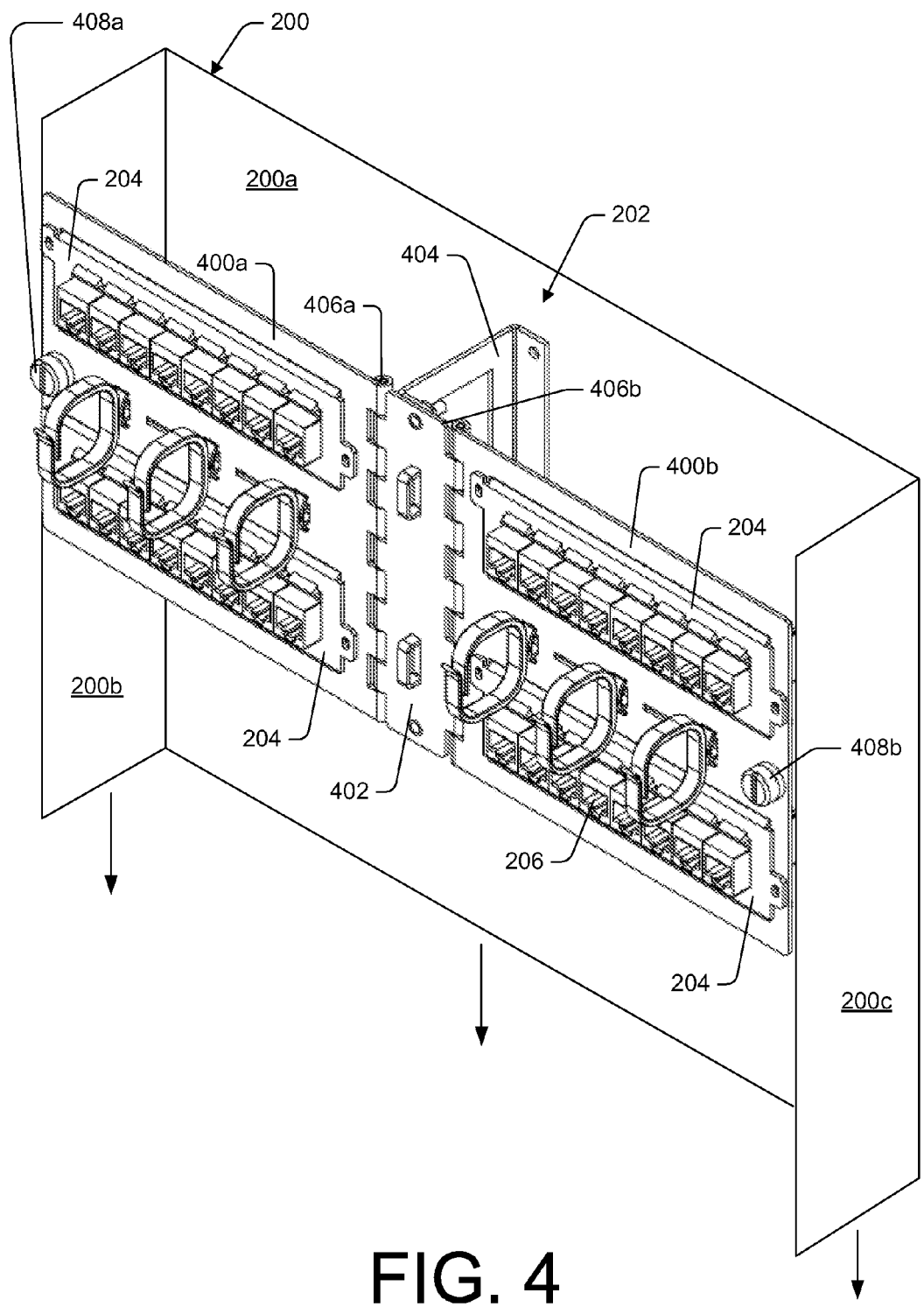
FIG. 4 is a perspective view of an illustrative chassis usable in structured cabling installations.

FIG. 4 is a perspective view showing one of the chassis 202 of FIG. 2 in more detail. As shown in FIG. 4, the chassis 202 generally comprises first and second substantially planar side members 400a and 400b, with a central spine 402 interposed between them. The spine 402 is fixedly coupled to the frame 200 via a standoff 404. The first and second side members 400a and 400b are pivotably coupled to the spine 402 via hinges 406a and 406b, respectively.

Modules 204, each having one or more signal connectors 206, are coupled to the chassis 202, along with cable guides 210 and cable retention straps 212. While the modules 204 are shown in this implementation including RJ45 signal connectors 206, in other implementations, modules may include other types of signal connectors (e.g., RF signal connectors, telephone connectors, terminal posts, etc.), switches, amplifiers, splitters, combiners, power receptacles, power supplies, cover plates, or any other component suited for a particular structured cabling installation.

In FIG. 4, the frame 200 is shown as having a back 200a and two sides 200b and 200c. Since there is no top or bottom to this frame 200, the media gateway 102 is readily expandable by simply adding more chassis above or below existing chassis. The substantially planar side members 400a and 400b of the chassis 202 are securable to the frame sides 200b and 200c, respectively, by latch mechanisms 408a and 408b.

Figure 5A:
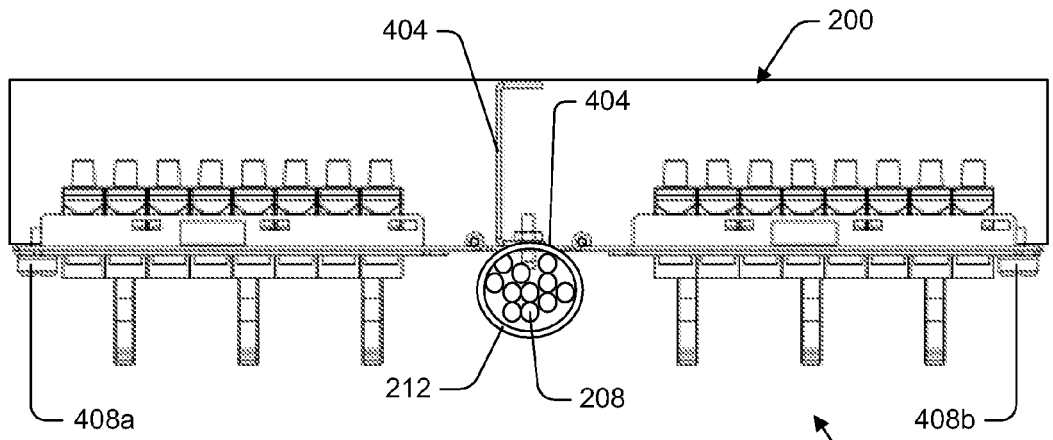
FIG. 5A is a top view of the chassis of FIG. 4 in a first, planar position.
Figure 5B:
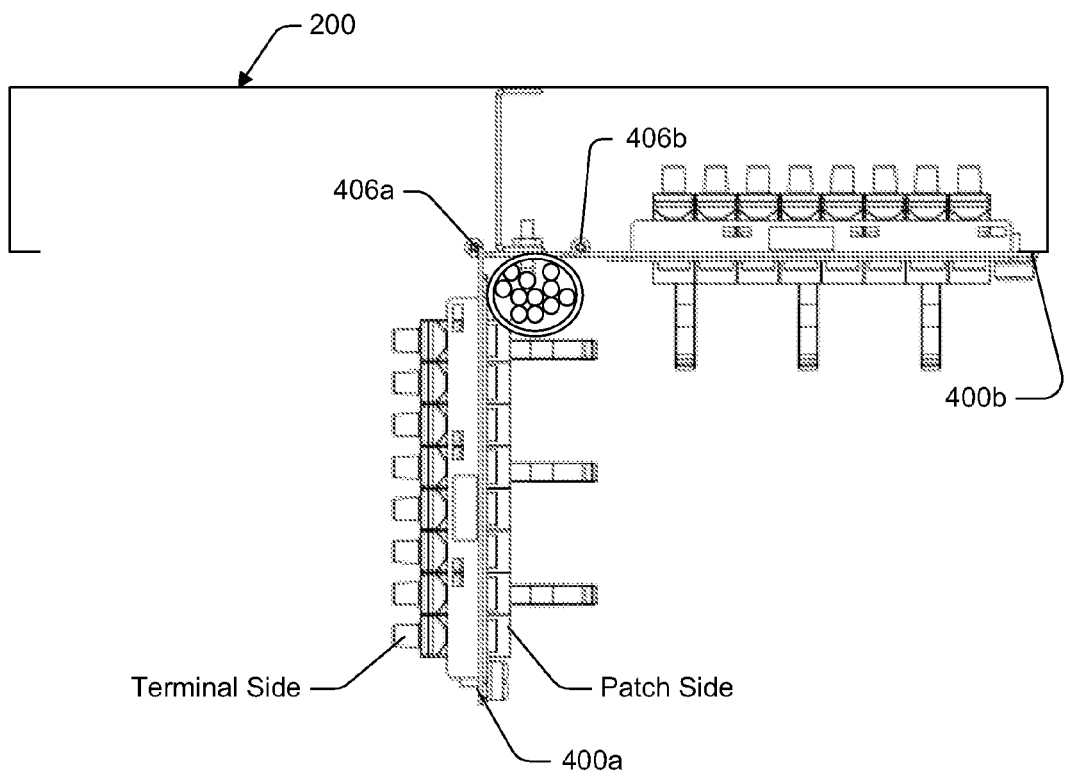
FIG. 5B is a top view of the chassis of FIG. 4 in a second position, with a left side member pivoted by about ninety degrees.

FIGS. 5A and 5B illustrate the pivotability of the chassis 202. As discussed above, the spine 402 is fixedly coupled to the frame 200 via standoff 404, while the side members 400a and 400b are pivotably coupled to the spine 402. Thus, the first and second side members 400a and 400b are each pivotable relative to the frame 200 between a first position (shown in FIG. 5A), in which the terminal side of the signal connectors 206 is enclosed within the frame 200 and is inaccessible, and a second position (shown in FIG. 5B), in which the terminal side of the signal connectors 206 is accessible. When engaged, the latch mechanisms 408a and 408b secure the side members 400a and 400b of the chassis in the first position. In this implementation, both of the latch mechanisms 408a and 408b are shown as being actuatable by a screwdriver or by hand (e.g., by twisting a knurled knob). However, in other implementations, one or both of the latch mechanisms may require a key or some other specialized tool for actuation.

During use, patch cables 208 may be routed vertically along the spine 402. The width of the spine 402 is sufficient to accommodate the patch cables 208 so that the patch cables do not interfere with pivoting motion of the side members 400a and 400b of the chassis 202. Thus, the spine 402 may at least partially define a patch cable pathway P. While the chassis 202 in this implementation have two centrally located hinges spaced apart, in other implementations, chassis may have only a single hinge located centrally, along a top, bottom, or side of the chassis. In other implementations, the chassis may additionally or alternatively be slidable, or otherwise movable relative to the frame. One example of another movable implementation includes a door that rotates down revealing rear access via a horizontally oriented hinge. In still other implementations, the chassis may be fixedly mounted to the frame.

Figure 6:
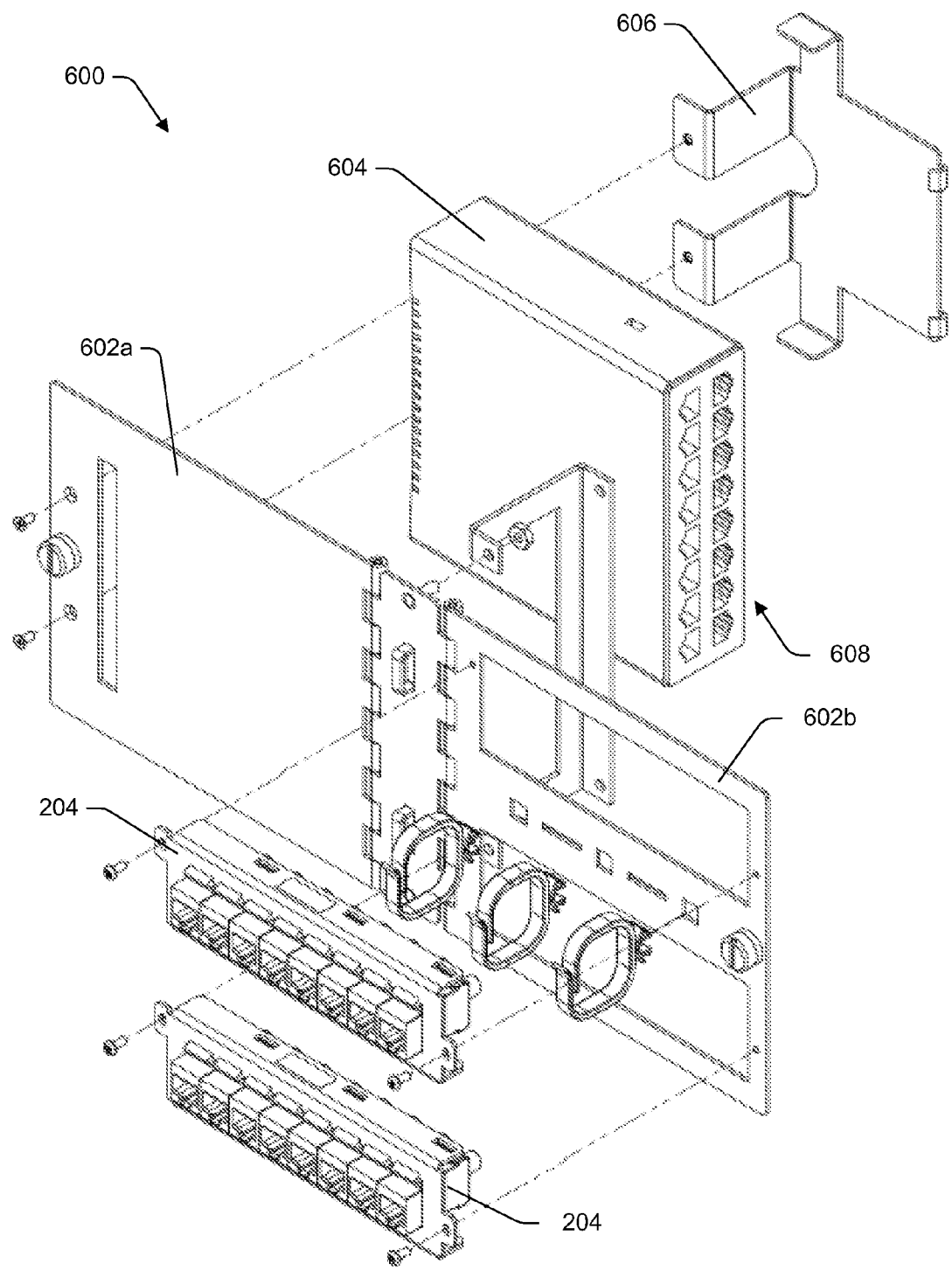
FIG. 6 is an exploded view of another illustrative chassis usable in structured cabling installations.

FIG. 6 is an exploded view illustrating another illustrative chassis 600 usable with a media gateway 102. The chassis 600 is similar in many respects to the chassis 202 shown in FIG. 4. However, one substantially planar side member 602a (left side in FIG. 6) has a hub or switch (and/or other signal generating or routing devices) 604 coupled to a back side thereof by a bracket 606. The switch 604 includes a number of ports 608 usable to interconnect components (e.g., components of a local area network). The other substantially planar side member 602b (right side in FIG. 6) has two signal carrier modules 204 mounted thereto. Of course, in other implementations, chassis may have any number of modules, switches, connectors, and/or other hardware mounted thereto.

In the media gateway 102 shown in FIG. 2, each chassis 202 has a predetermined form factor or a multiple of the predetermined form factor. Each chassis 202 comprises one or more modules 204, each module 204 comprising a second predetermined form factor that is smaller than the first form factor or a multiple of the second predetermined form factor. This uniformity of form factors means that any type of module 204 can be installed in any chassis 202, and any chassis 202 can be installed at any location in the frame 200, making the media gateway 102 extremely flexible.

Figure 7:
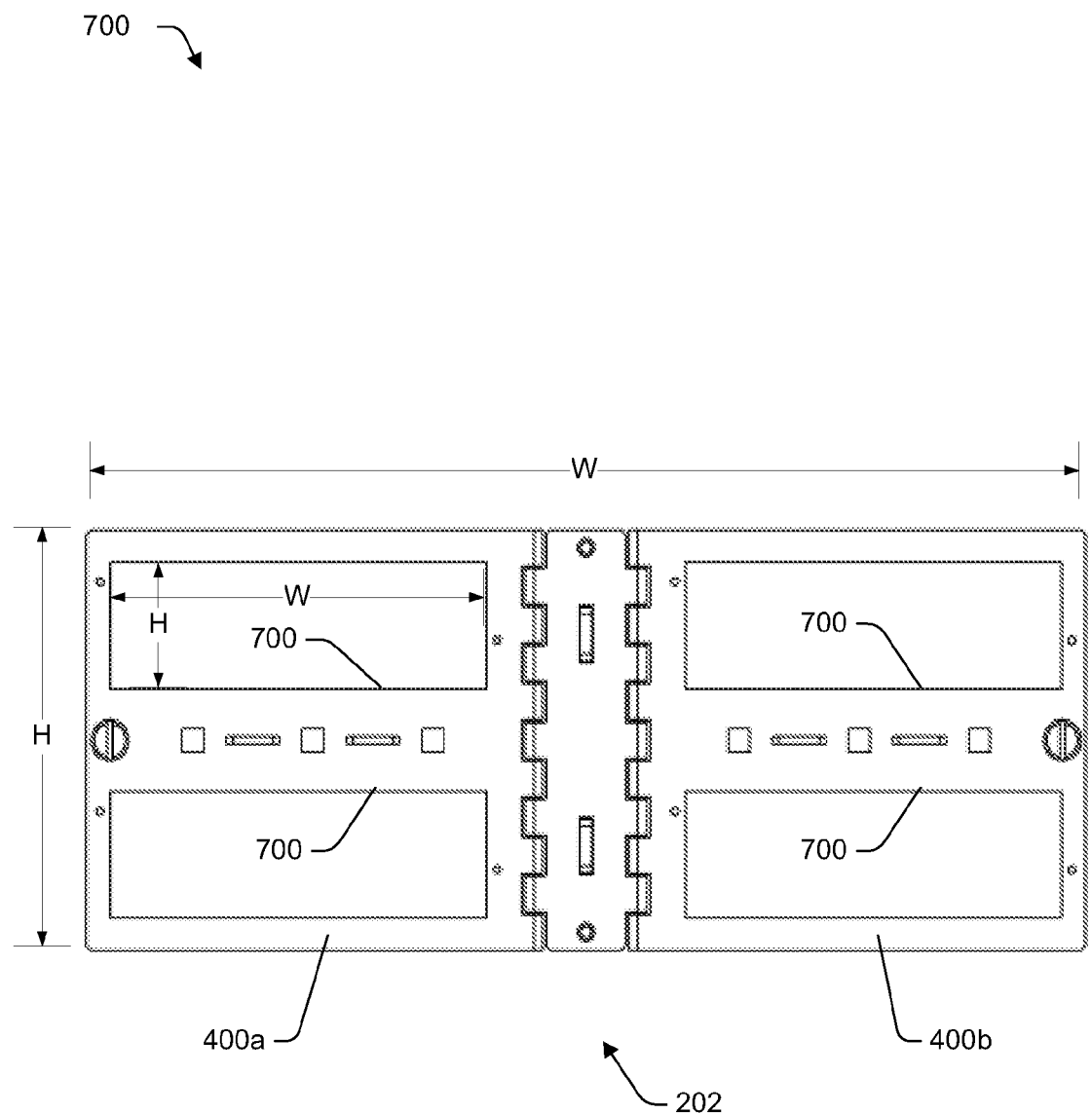
FIG. 7 is a front view showing additional details of an illustrative chassis usable in structured cabling installations.

FIG. 7 is a front view of the chassis 202 of FIG. 4, without any modules or cable management structures mounted thereto. The chassis 202 may be made any suitable size for a given application. Generally, however, the chassis will be at most about 24 inches (61 centimeters) wide so as to fit between studs in a standard stick built structure with 24 inch stud spacing. Alternatively, in structures with 16 inch stud spacing, the chassis may be at most about 16 inches (41 centimeters) wide. In some illustrative implementations, the chassis 202 have overall dimensions of at least about 13 inches (33 centimeters) and at most about 15 inches (38 centimeters) wide, and at least about 4 inches (10 centimeters) and at most about 7 inches (18 centimeters) high. In one implementation, the chassis has overall dimensions of about 14 inches (35.5 centimeters) wide and about 5.5 inches (14 centimeters) high. In still other alternatives, the frame, panel, and/or chassis may be configured to be mounted external to a wall (rather than recessed between studs), to a rack, or to some other support structure directly or via one or more mounting brackets. In such alternatives, the frame, panel, and chassis may be made in any suitable size and is not limited by stud spacing.

As illustrated, each of the first and second planar side members 400a and 400b includes a pair of cutouts 700 configured to receive a variety of different modules. The cutouts 700 also may be of any suitable size, limited only by the size of the chassis which they are cut in. In some illustrative implementations, the cutouts 700 are at least about 4.5 inches (11.5 centimeters) and at most about 6 inches (15 centimeters) wide, and at least about 1 inch (2.5 centimeters) and at most about 2 inches (5 centimeters) tall. In one implementation, the cutouts 700 are about 5.3 inches (13.5 centimeters), and about 1.7 inches (4.3 centimeters) tall.

Figure 8:
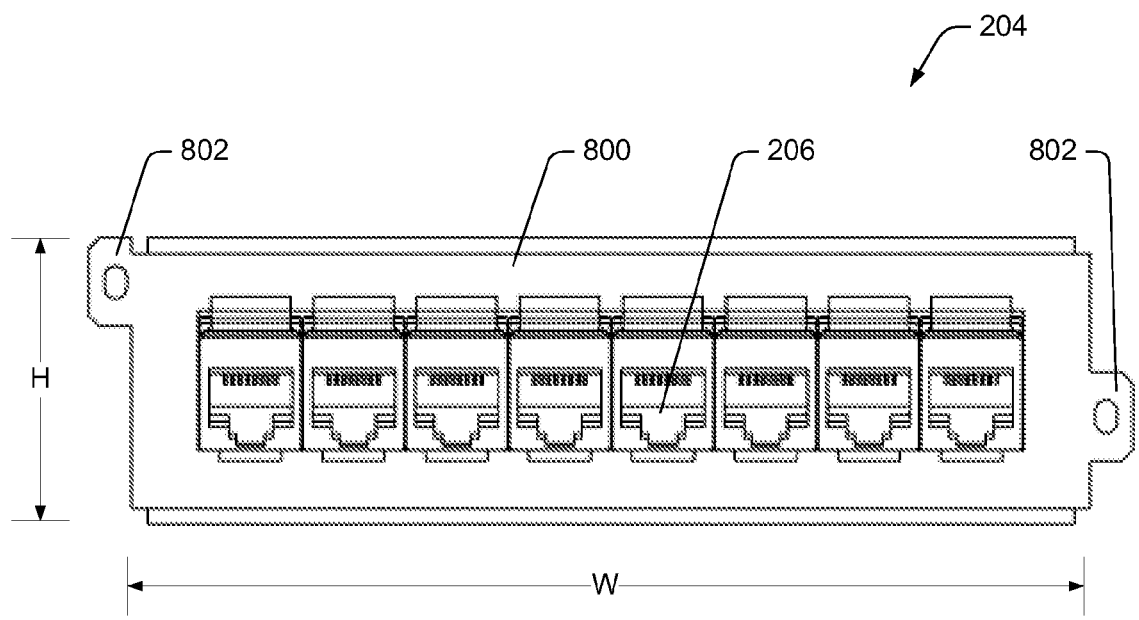
FIG. 8 is a front view of an illustrative module usable in structured cabling installations.

FIG. 8 illustrates one illustrative module 204 that may be configured to fit in cutouts of a chassis. Generally, modules may hold any sort of components desired for a given structured cabling installation, such as, for example, signal connectors (e.g., RF signal connectors, telephone connectors, terminal posts, etc.), switches, amplifiers, splitters, combiners, power receptacles, power supplies, cover plates. In the implementation shown in FIG. 8, the module 204 includes eight RJ-45 signal connectors. In some implementations, the modules 204 may include a generally rectangular mounting plate 804 having a pair of mounting tabs 802, the mounting tabs 802 being disposed proximate to diagonally opposite corners of the mounting plate 800. This location of the mounting tabs 802 provides a stable mounting configuration with minimal number of fasteners. However, in other implementations, any number and location of mounting tabs, holes, or other mounting features may be used to secure modules to a chassis. The modules may be made any suitable size, limited only by the cutouts in the chassis in which they are to be installed. In some implementations, modules may have dimensions of at least about 4.5 inches (11.5 centimeters) and at most about 6 inches (15 centimeters) wide, and at least about 1 inch (2.5 centimeters) and at most about 2 inches (5 centimeters) tall. In one implementation, the modules 204 are about 5.3 inches (13.5 centimeters), and about 1.7 inches (4.3 centimeters) tall.

The sizes of the chassis 202 and module 204 of FIGS. 7 and 8 are examples of the first and second form factors, respectively. As discussed above, multiples of each of these form factors are also possible. For example, each chassis, cutout, and/or module may be a factor of two, three, four, or more times the size of those shown in the vertical and/or horizontal directions.

Illustrative Zones of Accessibility

Figure 9:
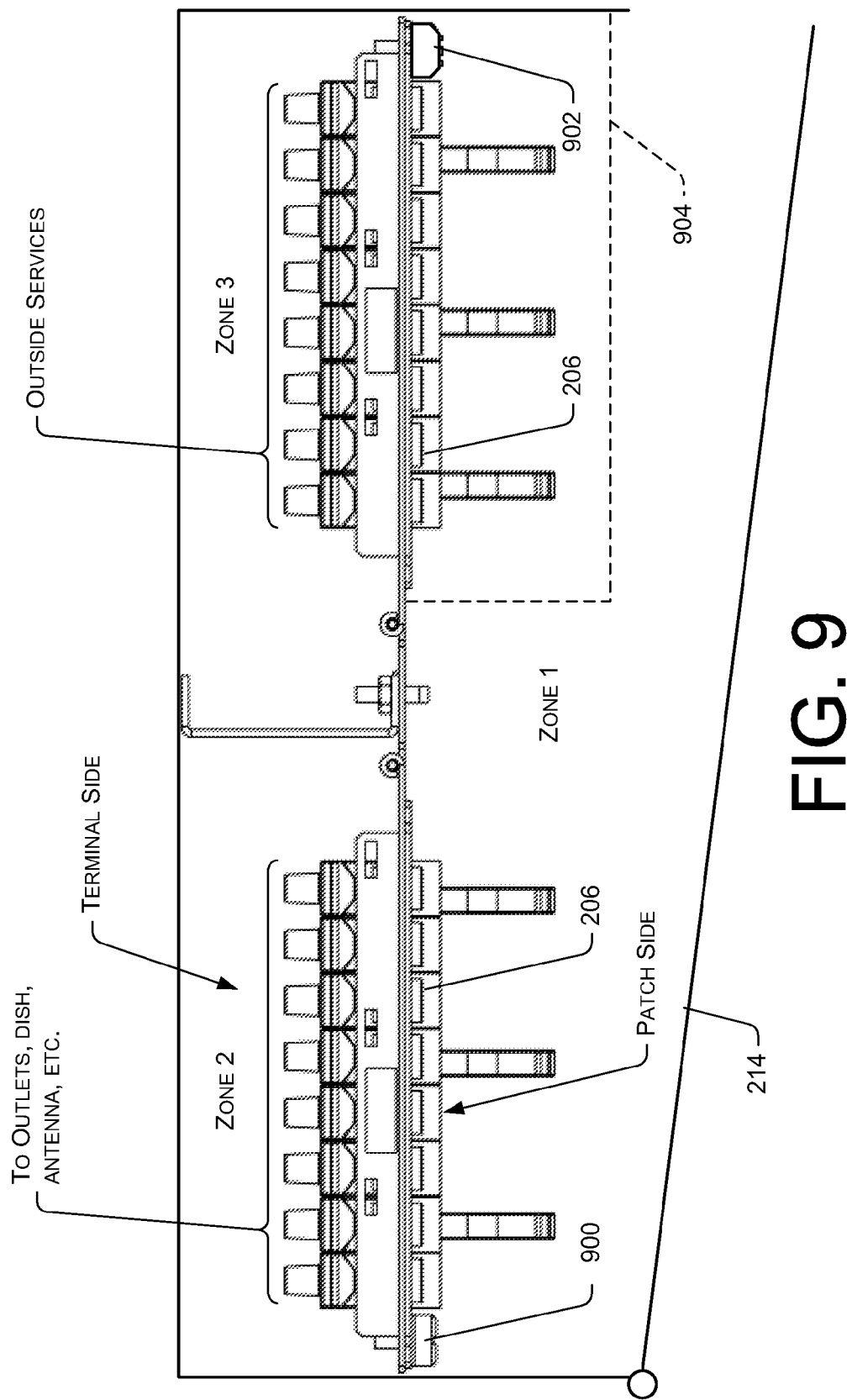
FIG. 9 is a schematic diagram illustrating a structured cabling installation, in which different zones of an installation have different levels of accessibility.

FIG. 9 is a schematic diagram illustrating various zones of accessibly within a media gateway 102. Generally, media gateways may have various different regions or zones that are typically accessed by different individuals at different times. For example, some zones may be readily accessed by a homeowner or other users of the media gateway to patch between various signal connectors 206. Other zones may be accessed during installation and maintenance of the frame 200 (e.g., terminations of signal carriers between outlets 104 and the terminal side of signal connectors). Still other zones may be accessed during hook-up of new services (e.g., terminations of outside service cables to the terminal side of signal connectors). The media gateway 102 may provide the ability to restrict access to one or more of these or other zones. In addition, the media gateway may provide varying degrees of accessibility for the zones. For example, some zones may be freely accessible, others may require manipulation of a latch, door, or other access mechanism (e.g., configured for actuation by hand or by a publicly available tool), and still other zones may require use of a key, security device, or other private tool for access.

In the example of FIG. 9, the media gateway 102 has three zones of accessibility, while in other implementations any number of one or more zones may be provided. A first zone (Zone 1) includes the patch side of signal connectors 206 and in this case is defined by the front of the chassis 202. Zone 1 is designed to be accessed by a user of the media gateway 102 will little or no effort, to install and/or change patch cable connections between signal connectors 206 of the media gateway 102. If the media gateway 102 has an access door 214, access to Zone 1 may be somewhat limited by the access door 214. If no access door is provided, Zone 1 is always open and accessible.

A second zone (Zone 2) includes the terminal side of signal connectors communicatively coupled to outlets 104 of the structured cabling installation, communication equipment (e.g., antennas, satellite dishes, etc.), or the like. Zone 2 generally only is accessed during installation or modification of the structured cabling installation. However, there may be instances in which the user desires to access this portion (e.g., to troubleshoot the system or to do a home installation of some additional system). Thus, Zone 2 is not as easily accessible as Zone 1. In the illustrated example, Zone 2 may be accessed by actuating a first latching mechanism 900 comprising a latching mechanism. The latching mechanism may be actuatable by hand (e.g., a knurled knob that is rotatable by hand, a slam latch, or the like) or may require a publicly available tool, such as a screw driver, Allen wrench, or the like.

A third zone (Zone 3) includes the terminal side of signal connectors communicatively coupled to outside services, such as telephone service 122a or cable television service 122b. Zone 3 generally is accessed by technicians of one or more service providers. For example, service providers may wish to limit customers' access to the connection of the outside services to prevent tampering with the connections and/or unauthorized use of the outside services. In that case, Zone 3 may be even less easily accessed than Zone 2. Thus, Zone 3 may only be accessed using a private tool, such as a key, security code, or the like. In the illustrated example, access to Zone 3 is governed by a barrel lock 902, which is accessible using a barrel lock key. In other implementations, however, other types of locks or security features may be used to limit access. Also, while both the telephone service and cable television service are shown as part of the same zone, in other implementations, each outside service may be provided in its own limited access zone protected by separate locking or other security features.

In the illustrated implementation, the front surface of the chassis defines Zone 1, the back surface of the first side flap 400a defines Zone 2, and the back surface of the second side flap 400b defines Zone 3. However, in other implementations, these and other zones may be defined by any areas having differing levels of accessibility. For example, a fourth zone could be defined by providing a cover 904 (shown in broken lines) over a portion of the front of the chassis 202, limiting access to some of the signal connectors 206 on the front of the chassis 202. If provided, the cover 904 may also be secured by a lock or other security feature. In another example, in a media gateway having multiple chassis, each chassis may define various different zones of accessibility.

Illustrative Labeling Scheme

The media gateway 102 and each of its components are designed to provide simple and organized components for installation as part of a structured cabling solution. The simplicity and organization of a structured cabling solution can be enhanced when combined with a labeling scheme, such as the illustrative labeling scheme described in this section. While the labeling scheme is described in the context of the media gateway 102, the labeling scheme may be more broadly applicable to any cabling installation. Briefly, the labeling scheme provides an intuitive way for a user to know which signal connector in the media gateway 102 or other media panel corresponds to each outlet throughout the installation, and each receptacle within each outlet. The labeling scheme generally includes two parts, labels at each outlet and corresponding labels at the media gateway.

On the outlet side, the labeling scheme generally comprises labeling each outlet with an outlet identifier unique to the structured cabling installation, and labeling each receptacle within each outlet with a receptacle identifier unique to the outlet. Thus, each receptacle in the structured cabling installation can be uniquely identified by the outlet identifier and the receptacle identifier. At the media gateway 102, signal connectors are labeled with the outlet identifier and the receptacle identifier corresponding to the outlet receptacle to which the signal connector is communicatively coupled. In addition, incoming sources of media from outside cables or other sources may be labeled according to the type of media provided (e.g., voice, data, video, television, or the like).

FIGS. 10-14 illustrate one illustrative labeling scheme that may, but need not necessarily, be used with the media gateway 102 and structured cabling components described herein.

Figure 10A:
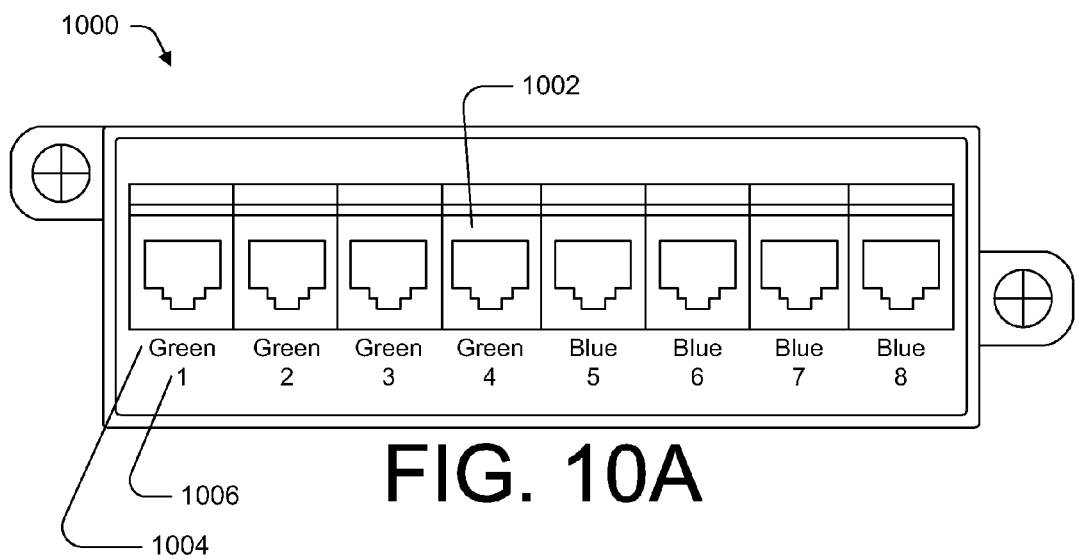
FIGS. 10A and 10B are schematic diagrams showing illustrative labeling schemes for modules providing connections to incoming services from service providers.
Figure 10B:
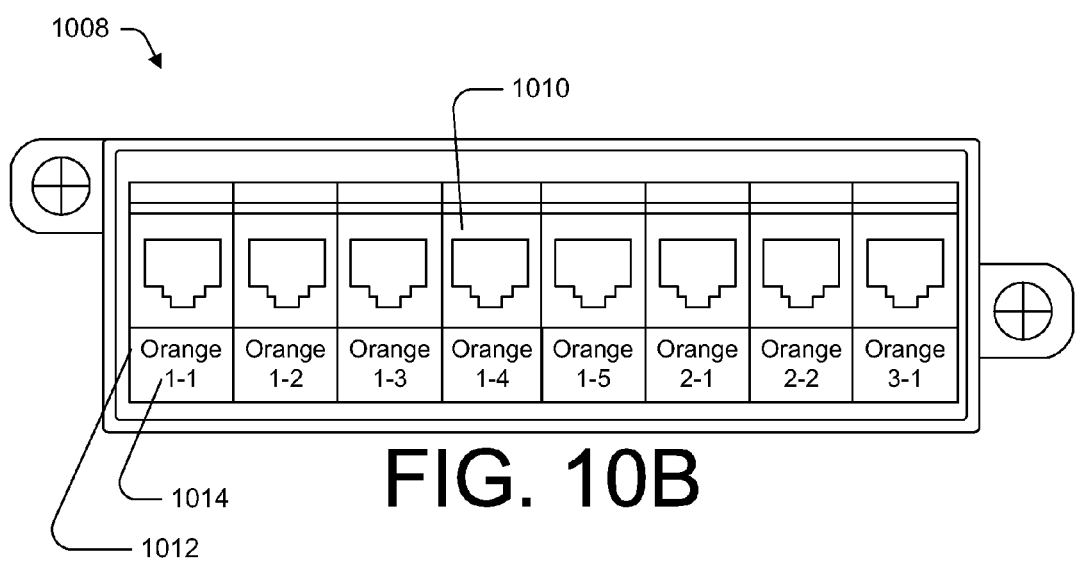

FIGS. 10A and 10B illustrate two illustrative modules that could be installed in the media gateway 102 to terminate incoming sources of media. In particular, FIG. 10A illustrates a demarcation module 1000 for terminating incoming services from one or more service providers, such as a cable television provider, for example. The module 1000 has eight RJ-45 signal connectors 1002, each of which provides a connection to the source of media content. The signal connectors 1002 include a media-type designator 1004 that allows the service provider or the end user to designate what services are available at each RJ-45 port on the demarcation module 1000. In this example, the media-type designator is a color code, with blue and green, representing data (e.g., Internet) and video (e.g., IP video) services, respectively. While the color code is shown textually in the drawings, it should be understood that these textual labels represent the noted colors. That is, the ports or portions thereof may actually be the noted colors, or may include a marking in that color (e.g., a dot, bar, band, letter, number, symbol, etc.). Also, each signal connector 1002 is labeled with a port identifier 1006, which in this implementation is shown as a numerical identifier.

FIG. 10B illustrates a voice bridge module 1008 that may be installed in the media gateway to terminate telephone service. The voice bridge 1008 includes a number of signal connectors 1010, which are illustrated as RJ-45 ports in this implementation. The voice bridge 1008 also includes a media-type designator 1012 (in this case, orange is used to designate voice) and a port identifier 1014. The incoming telephone service from a service provider is terminated on the back side of the bridge onto a 110-style punch down (not shown). Two of the wires from the incoming phone service are used for the primary telephone service, and are bridged onto the first five ports on the voice bridge 1008. The port identifiers 1014 in this implementation identify both the phone line and the port number of that phone line. That is, the fourth signal connector port 1014 is designated by "1-4" which indicates that this signal connector corresponds to the first phone line, and is the fourth port for that phone line. Two more of the wires from the incoming phone service are used for a second telephone line and are terminated to the $6^{th}$ and $7^{th}$ port of the voice bridge. Two more wires from the incoming phone service are used for a third telephone line and are terminated to the $8^{th}$ port of the voice bridge. Of course, the illustrated configuration is just one of many possible hookups, and any number of one or more incoming phone lines may be terminated to signal connectors of voice bridges. Once the terminations have been made on the punch down on the back of the voice bridge 1008, the telephone lines are available to be patched to any receptacle on any outlet in the structured cabling installation.

While the media-type designators are shown as color codes and the port identifiers are shown as numerical identifiers, in other implementations, the media-type designators and the port identifiers could be designated by any combination of colors, numbers, letters, symbols, or other suitable identifiers.

Figure 11A:
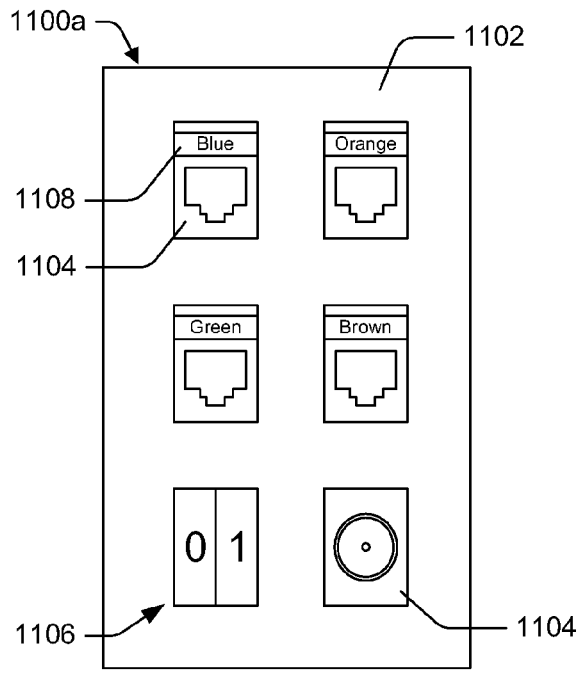
FIGS. 11A-11C are schematic diagrams showing an illustrative labeling scheme for outlets.
Figure 11B:
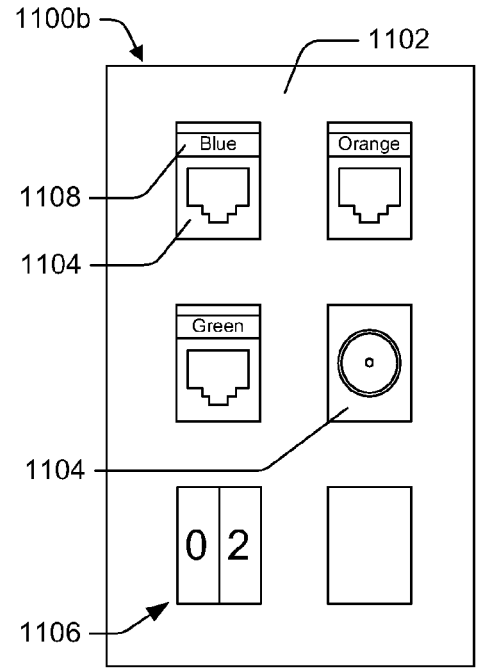
Figure 11C:
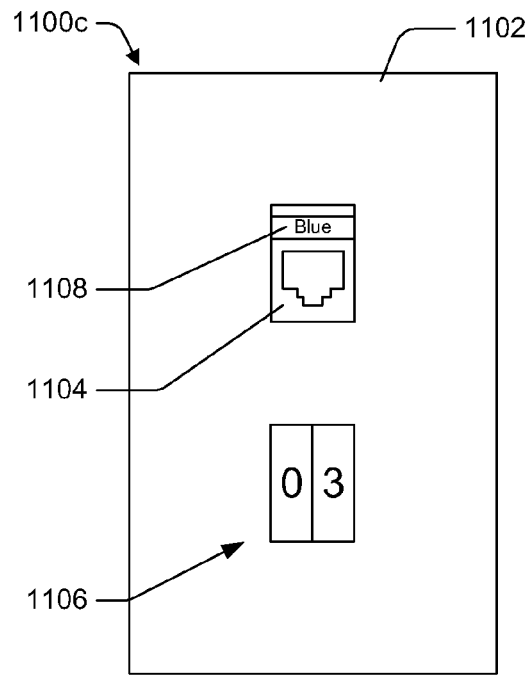

FIGS. 11A-11C illustrate several outlets 1100a-1100c labeled according to one illustrative labeling scheme. Each outlet comprises a wall plate 1102 with two or more cutouts. The cutouts in the wall plates 1102 are configured to receive receptacles 1104 (such as RJ-45 receptacles or RF receptacles). The number of receptacles in each outlet may vary. However, one of the cutouts in each wall plate 1102 is reserved for an outlet identifier 1106. In this implementation, the outlet identifier 1106 comprises one or more molded number inserts. In particular, the outlet identifier 106 comprises two molded number inserts, chosen from the numbers zero to nine. Thus, in the illustrated implementation, outlets can be numbered from 0-99. A second cutout in each outlet could be used to expand the number of outlets in each installation to 9999. While the inserts are described as being molded, in other instances, the inserts may be stamped, extruded, or made in any other known manner. In addition, instead of inserts, the outlet designators 1106 may be painted, engraved, raised, etched, stamped, applied as adhesive labels, or marked in any other known manner.

In the illustrated implementation, the minimum number of cutouts in each wall plate 1102 is two ports (to accommodate the numbering system) and the maximum is six ports. However, in other implementations, wall plates having any number of one or more cutouts may be used if the outlets are marked in a manner not requiring a cutout.

The individual receptacles within each outlet are labeled with a receptacle designator 1108. In the illustrated implementations, the receptacle designators 1108 are color coded (blue, orange, green, and brown). Thus, each outlet can be uniquely identified using the outlet designator 1106 and the receptacle designator 1108 (e.g., receptacle 4-blue would correspond to the blue receptacle in outlet number 4). This same combination of colors and numbers is matched in the labeling designations for signal connectors in the media gateway 102.

The colors of the receptacle designators 1108 may, but need not, also designate the type of media available at the receptacle (e.g., blue receptacles are generally used for data, green for video, orange for voice, and brown for television). However, the type of media available at a given receptacle is not limited by the color of the receptacle, and depends only on a media source to which the receptacle is patched in the media gateway 102. For example, in an office, a user may wish to patch all four of the RJ-45 receptacles in outlet 1100a to data service for networking purposes.

Figure 12A:
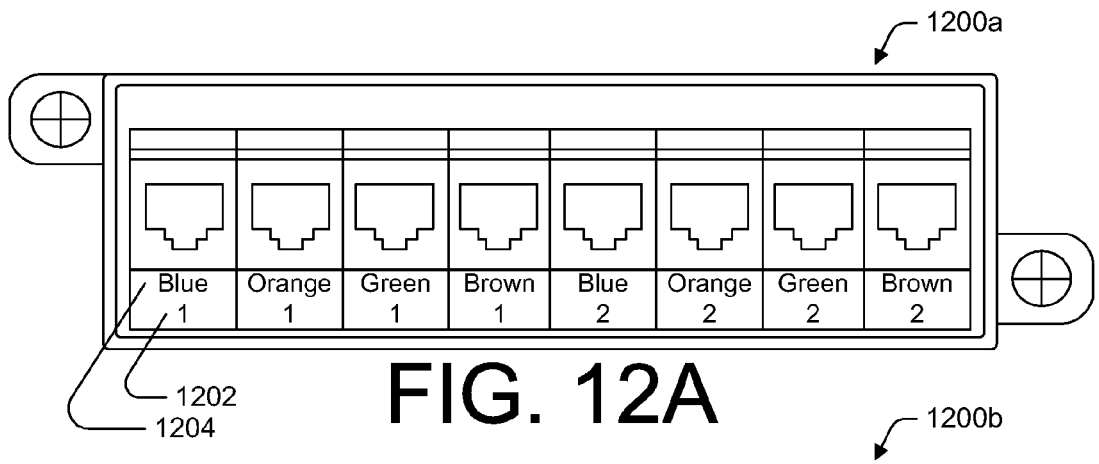
FIGS. 12A-12D are schematic diagrams showing an illustrative labeling scheme for modules providing patch connections to one or more outlets in the structured cabling installation.
Figure 12B:
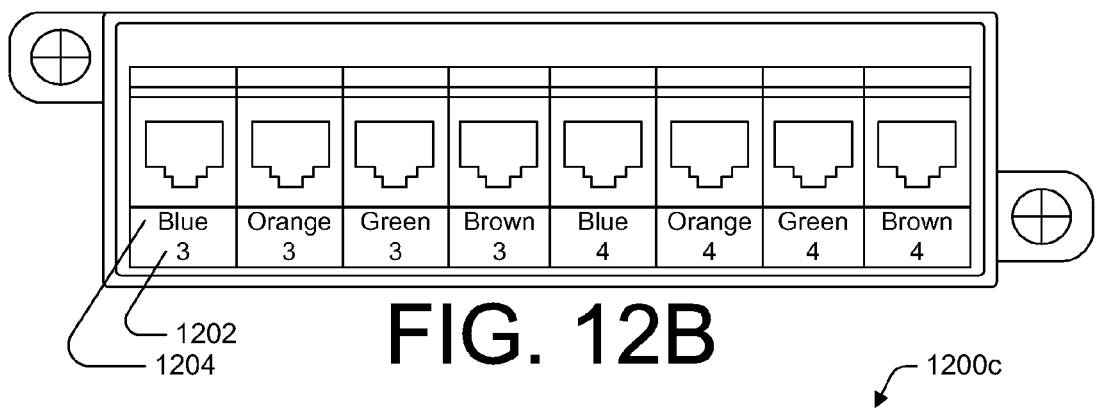
Figure 12C:
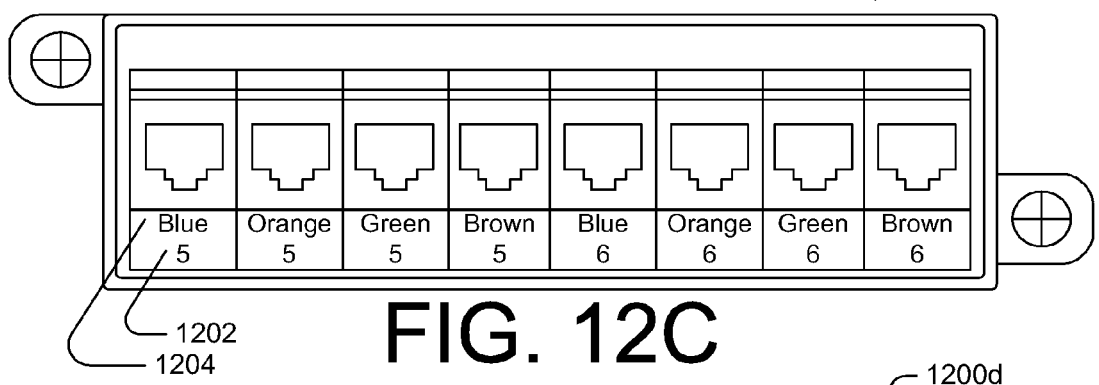
Figure 12D:
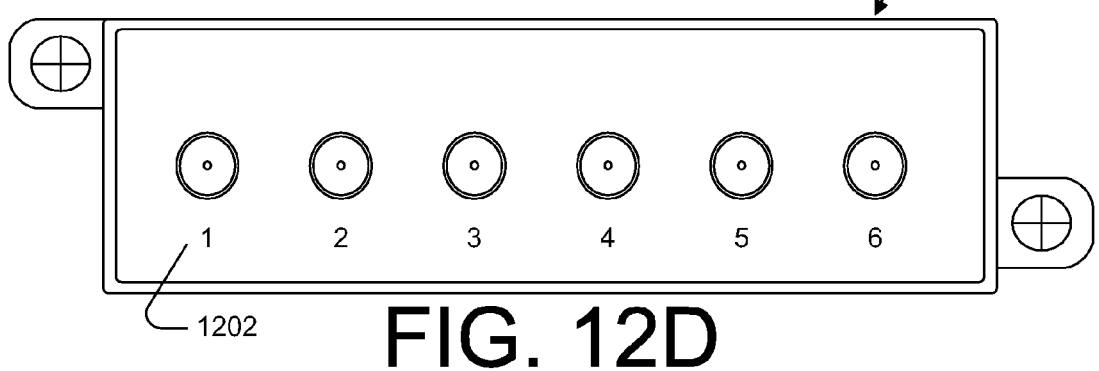

FIGS. 12A-12D illustrate signal connector modules 1200a-1200d that may be installed in the media gateway corresponding to the outlet configuration shown in FIG. 11A, having four RJ-45 signal connectors and one RF connector. In this configuration, FIGS. 12A-12C illustrate three RJ-45 signal connector modules 1200a-1200c that correspond to six different outlets in a hypothetical structured cabling installation. Each signal connector in modules 1200a-1200c includes an outlet designator 1202 designating an outlet, and a receptacle designator 1204 designating the receptacle within each outlet, to which the signal connector corresponds. FIG. 12D illustrates an RF signal connector module 1200d, having six RF signal connectors labeled with an outlet identifier 1202 corresponding to the outlet having the corresponding RF receptacle. Because the outlets in this configuration only include one RF receptacle, a receptacle identifier is not required to identify the RF receptacle within the outlet. However, if multiple RF receptacles were provided within an outlet, each RF signal connector could also include a suitable color code or other receptacle identifier to identify each RF receptacle within the outlet.

Figure 13A:
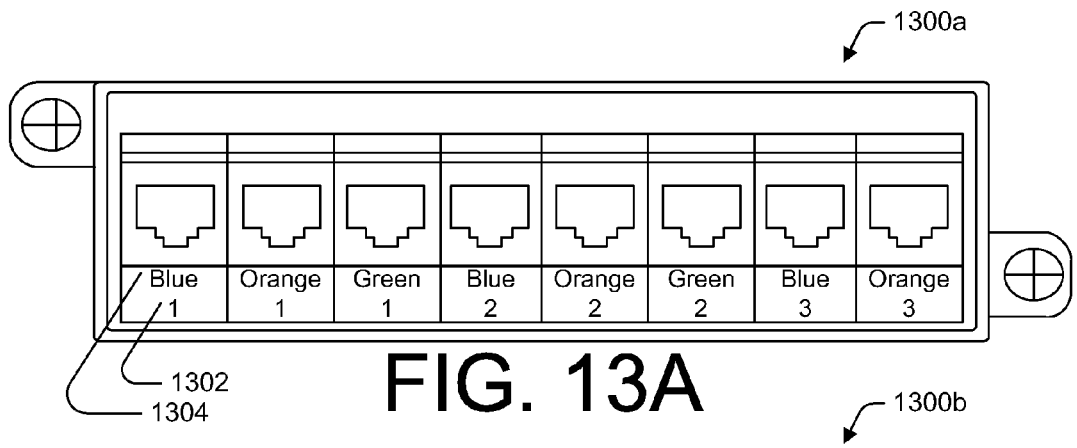
FIGS. 13A-13D are schematic diagrams showing another illustrative labeling scheme for modules providing patch connections to one or more outlets in the structured cabling installation.
Figure 13B:
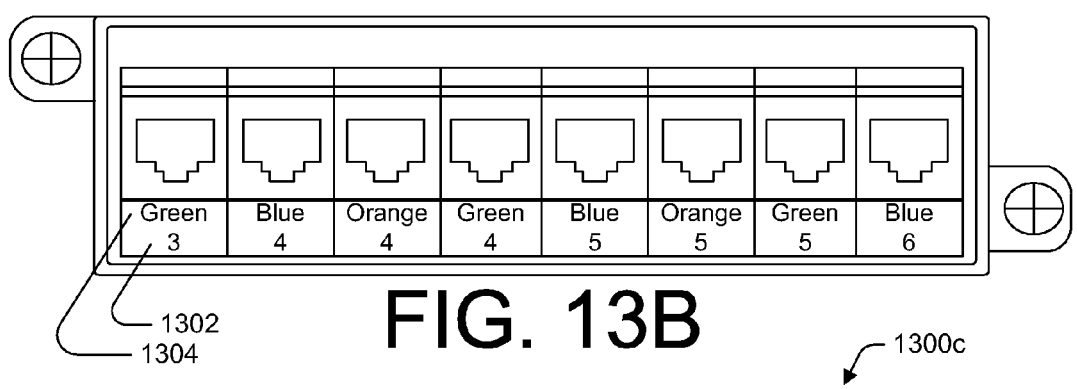
Figure 13C:
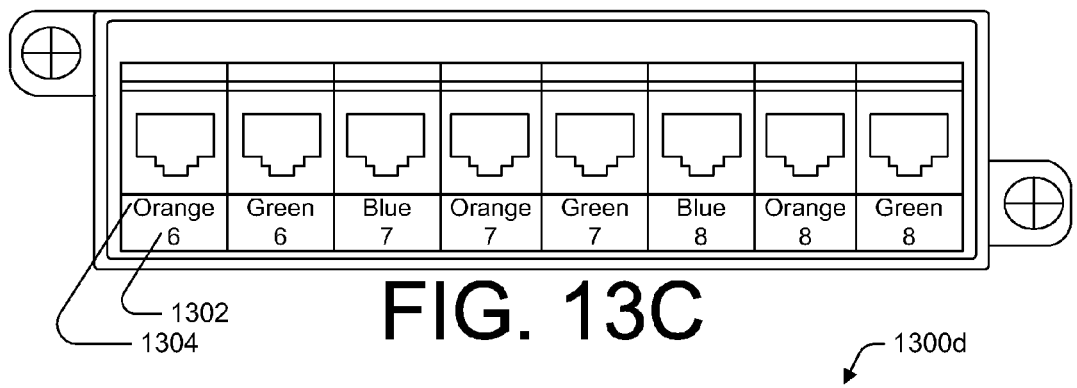
Figure 13D:
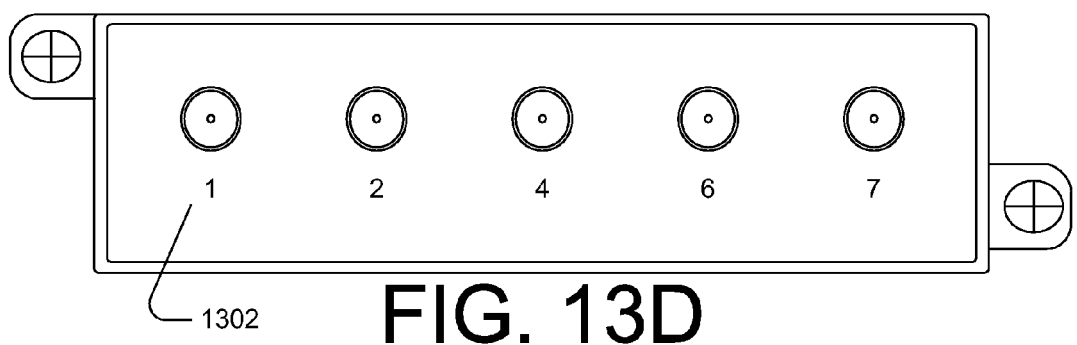

FIGS. 13A-13D illustrate signal connector modules 1300a-1300d that may be installed in the media gateway corresponding to the outlet configuration shown in FIG. 11B, having three RJ-45 signal connectors and one RF connector. In this configuration, FIGS. 13A-13C illustrate three RJ-45 signal connector modules 1300a-1300c that correspond to eight different outlets in a hypothetical structured cabling installation. Each signal connector in modules 1300a-1300c includes an outlet designator 1302 designating an outlet, and a receptacle designator 1304 designating the receptacle within each outlet, to which the signal connector corresponds. FIG. 13D illustrates an RF signal connector module 1300d, having five RF signal connectors labeled with an outlet identifier 1302 corresponding to the outlet having the corresponding RF receptacle. In this implementation, only five of the eight outlets (outlets 1, 2, 4, 6, and 7) in the hypothetical installation include an RF receptacle. However, if multiple RF receptacles were provided within an outlet, each RF receptacle could also include a suitable color code or other receptacle identifier to identify each RF receptacle within the outlet.

Figure 14:
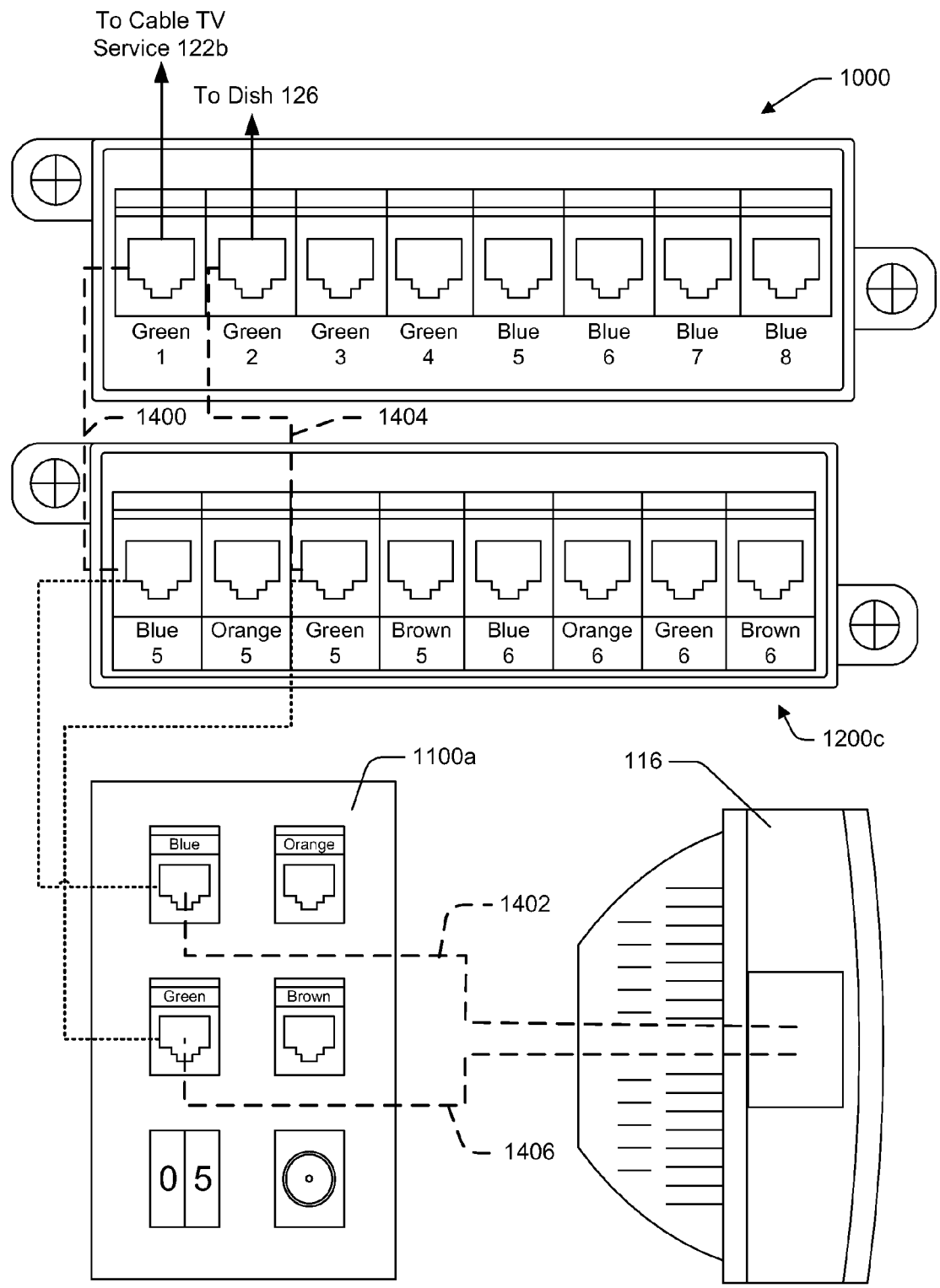
FIG. 14 is a schematic diagram showing one illustrative application of the labeling scheme of FIGS. 10A, 11A, and 12A-12D.

FIG. 14 is a schematic diagram showing one specific example of hooking a television, such as television 116 in room D in FIG. 1, to cable television service and satellite service using the labeling schemes described with respect to FIGS. 10-13. In this example, cable television service 122b is terminated to demarcation module 1000 at a signal connector labeled "Green-1" (i.e., a green/video media-type designator and port identifier number 1). A patch cable 1400 is coupled between Green-1 on the demarcation module 1000 and a port on RJ-45 signal connector module 1200c labeled "Blue-5" (corresponding to the blue receptacle in outlet number 5, the outlet located in room D of the structured cabling installation). A patch cable 1402 is then used to plug the television 116 (or a receiver or IP video set-top-box coupled to the television) into the blue receptacle of outlet 5 in room D.

A satellite dish, such as satellite dish 126, is communicatively coupled to demarcation module 1000 at a signal connector labeled "Green-2." A patch cable 1404 is coupled between Green-2 on the demarcation module 1000 and a port on RJ-45 signal connector module 1200c labeled "Green-5" (corresponding to the green receptacle in outlet number 5). A patch cable 1406 is then used to plug the television 116 into the green receptacle of outlet 5.

While several illustrative implementations of structured cabling installations have been shown and described herein, it should be understood that the features of each of the installations may be rearranged, omitted, modified, and/or combined with one another. By way of example and not limitation, while the chassis are shown mounted in a partially enclosed panel, in other implementations, the chassis may be used with an open frame, one or more rails, or without any frame whatsoever. In another example, while the chassis are shown as being pivotable about two hinges, in other implementations, the chassis may be pivotable about a single hinge, may be slidable, may be removable, or may be otherwise movable relative to the frame. With respect to the labeling scheme, any combination of numbers, letters, colors, symbols, or other designators may be used as outlet designators, receptacle designators, and/or media-type designators. These and numerous other variations will be apparent to those of ordinary skill in the art.

The components of the media gateway, chassis, modules, cable management components, and other structured cabling components can be made of any material having the desired combination of strength, cost, weight, electrical conductivity, and other material properties, and can be made by conventional manufacturing and assembling processes. Several suitable materials include, for example, metals, plastics, polymers, composites, and the like.

Conclusion

Although implementations have been described in language specific to structural features and/or methodological acts, it is to be understood that the invention is not necessarily limited to the specific features or acts described. Rather, the specific features and acts are disclosed as illustrative forms of implementing the invention.

What is claimed is:

1. A telecommunications apparatus comprising:
   a frame;
   a chassis movably coupled to the frame, the chassis having a front side, a back side, a first substantially planar side member, a second substantially planar side member, and a central spine interposed between, and pivotably coupled to, the first and second side members; and
   one or more signal connectors coupled to the chassis, the signal connectors each having a patch connection disposed on the front side of the chassis and a terminal connection on the back side of the chassis,
   wherein the chassis is movable relative to the frame between:
   a first position in which the terminal connections on the back side of the chassis are disposed between the chassis and the frame and are inaccessible to a user, and
   a second position in which the terminal connections on the back side of the chassis are accessible to a user.

2. The telecommunications apparatus of claim 1, wherein the one or more chassis are pivotably coupled to the frame.

3. The telecommunications apparatus of claim 1, further comprising a module coupled to one of the first and second planar side members of each chassis, the module comprising the one or more signal connectors.

4. The telecommunications apparatus of claim 1, wherein the first planar side member includes an access mechanism operable by hand or by a publicly available tool, and wherein the second planar side member includes a latch operable using a private tool.

5. The telecommunications apparatus of claim 1, further comprising a standoff configured to fixedly couple the spine of each chassis to the frame, such that the first and second planar side members are pivotable relative to the frame.

6. The telecommunications apparatus of claim 1, wherein the chassis has overall dimensions of at least about 13 and at most about 15 inches wide, and at least about 4 and at most about 7 inches high.

7. The telecommunications apparatus of claim 1, wherein the apparatus comprises at least three zones including, a patch connection zone, a first terminal connection zone, and a second terminal connection zone, and wherein each zone has a different level of accessibility.

8. The telecommunications apparatus of claim 1, wherein the frame comprises an enclosure having at least three side walls.

9. The telecommunications apparatus of 1, wherein the chassis comprises a first module having a first type of signal connector and a second module having a second type of signal connector, and wherein the first module and the second module have a same form factor.

10. The telecommunications apparatus of claim 1, further comprising a label associated with each signal connector, the label identifying a wall plate and a jack in the wall plate to which the signal connector is connected.

11. The telecommunications apparatus of claim 1, further comprising a plurality of patch cables connected to patch sides of signal connectors of the chassis, each of the patch cables being routed in one or more predefined patch cable pathways, the predefined patch cable pathways consisting of substantially vertical pathways, substantially horizontal pathways, or both.

12. The telecommunications apparatus of claim 1, further comprising a plurality of patch cables connected to patch sides of signal connectors of the chassis, each of the patch cables being routed in one or more predefined patch cable pathways, the predefined patch cable pathways consisting of substantially vertical pathways, substantially horizontal pathways, or both, and
   wherein the system comprises at least three zones including, a patch connection zone, a first terminal connection zone, and a second terminal connection zone, and wherein each zone has a different level of accessibility.

* * * * *